United States Patent

Mollenstedt

[11] 3,993,905
[45] Nov. 23, 1976

[54] ELECTRON BEAM SCANNING APPARATUS FOR THE STRUCTURAL ANALYSIS OF SPECIMENS

[75] Inventor: Gottfried Mollenstedt, Tubingen, Germany

[73] Assignee: Siemens Aktiengesellschaft, Munich, Germany

[22] Filed: Oct. 30, 1975

[21] Appl. No.: 627,339

[30] Foreign Application Priority Data
Aug. 6, 1975  Germany............................ 2535510

[52] U.S. Cl. ............................... 250/310; 250/311
[51] Int. Cl.² .................. G01N 23/00; G21K 7/00; H01K 37/26
[58] Field of Search............................ 250/310, 311

[56] References Cited
UNITED STATES PATENTS
3,857,034  12/1974  Hoppe .............................. 250/310

*Primary Examiner*—Alfred E. Smith
*Assistant Examiner*—T. N. Grigsby
*Attorney, Agent, or Firm*—Kenyon & Kenyon Reilly Carr & Chapin

[57] ABSTRACT

In an electron beam scanning apparatus with ray penetration of the specimen, an additional deflection system provided between the specimen and the detector directs the transmitted primary beam always to the same point of the detector. The detector has different zones for separately registering the primary beam portion and the scattered portion, respectively, of the radiation penetrating the specimen.

3 Claims, 1 Drawing Figure

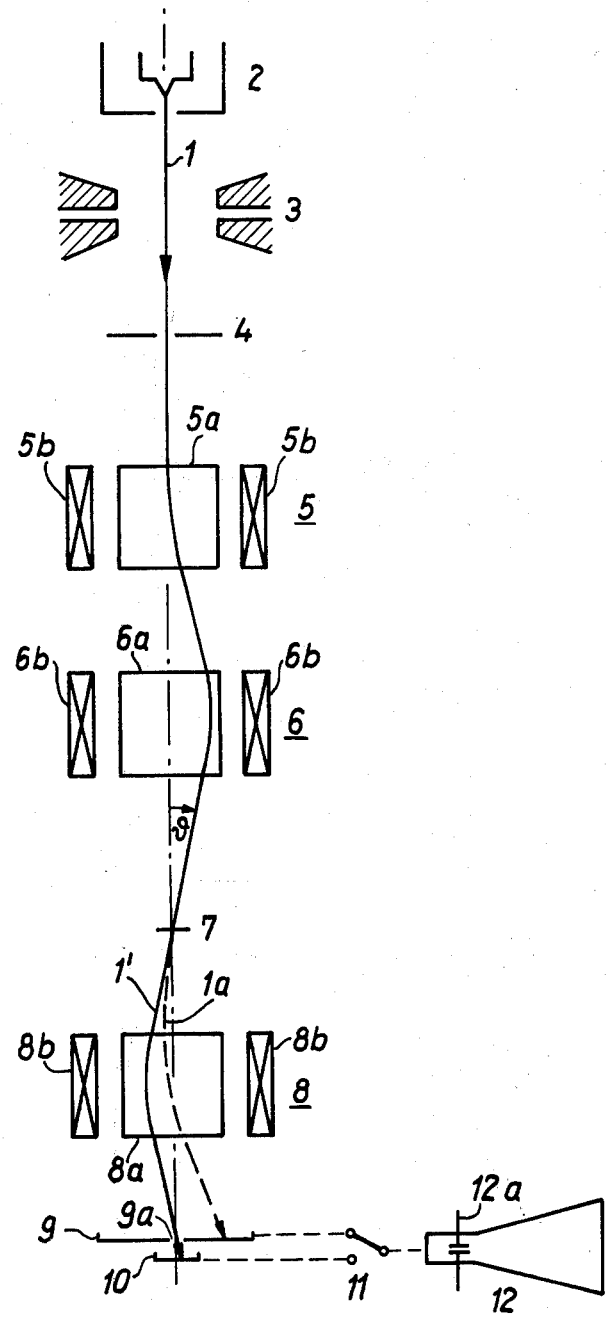

ELECTRON BEAM SCANNING APPARATUS FOR THE STRUCTURAL ANALYSIS OF SPECIMENS

BACKGROUND OF THE INVENTION

The invention relates to electron beam scanning apparatus for the structural analysis of specimens, and particularly to such apparatus having a deflection system arranged between the radiation source and the specimen, by which the beam is always directed to the same point of the specimen while scanning a solid angle with its apex located at this point, and a detector, arranged behind the specimen, for the radiation penetrating the specimen.

Electron beam scanning apparatus of this type is described in a paper by F. Fujimoto, K. Komaki, S. Tagaki and H. Koike in "Zeitschrift fuer Naturforschung" 27a (1972), pages 441 ff. In this apparatus, the radiation which penetrates the specimen, and consisting of the primary radiation and scatter radiation, passes across the detector according to the angles of incidence of the beam scanning the solid angle. The variable output of the detector is fed in the usual manner to a television tube (monitor) whose deflection system is driven synchronously with the scanning system of the scanning apparatus. In the examination of a single crystal, for example, a line pattern appears on the picture screen of the monitor that gives information regarding the structure of the crystal.

SUMMARY OF THE INVENTION

It is an object of the present invention to increase the contrast and the information content of the monitor picture in an electron beam scanning apparatus of the type described above. This object is achieved by providing between the specimen and the detector an additional deflection system which is driven synchronously with the first-mentioned deflection system in such a manner that the primary beam always strikes the same point of the detector, and the detector has at least one zone for separately registering the primary beam and/or the scatter radiation.

BRIEF DESCRIPTION OF THE DRAWING

The FIGURE shows schematically a preferred embodiment of the invention.

DESCRIPTION OF THE PREFERRED EMBODIMENT

As shown in the FIGURE, an electron beam 1 of the apparatus is emitted from an electron source 2. The beam passes through a condensor 3, a diaphragm 4, a deflection system 5/6, and then strikes the specimen 7. A further deflection system 8 and detectors 9 and 10 are arranged below the specimen 7. At the center of detector 9 is a hole 9a, the diameter of which is only slightly larger than the diameter of the electron beam in the detector plane. The outputs of detectors 9 and 10 are connected via a selector switch 11 with a schematically indicated monitor 12. The deflection system 12a of the monitor is excited synchronously with the deflection systems 5/6 and 8.

In the illustrated example, the deflection systems 5/6 and 8 are designed as magnetic deflection systems; however, electrostatic systems can also be used. The first subsystem 5 of deflection system 5/6 consists of two pairs of coils 5a and 5b; the second subsystem 6 and the additional deflection system 8, arranged below the specimen 7, are designed similarly. The pair of coils 5a is excited periodically in such a manner that electron beam 1 is deflected from the optical axis in the plane of the drawing. The pair of coils 6a deflects the beam back toward the axis, and specifically in such a manner that the beam, independently of its deflection, always strikes the same point of the specimen 7, preferably the point of intersection of the optical axis and the specimen.

The variable angle of incidence of the beam 1 on the specimen 7 is designated by the symbol $\nu$. The coil pairs 5b and 6b deflect the beam 1 in a similar manner perpendicularly to the plane of the drawing such that the beam strikes the fixed point of the specimen 7 at a variable angle $\phi$ in that plane. The maximum values of the angles $\nu$ and $\phi$ define a solid angle $\Omega$ scanned by the beam and having an apex located at the fixed point of the specimen.

The electron beam 1 should have uniform energy as far as possible. The accelerating voltage of the apparatus may be, for instance, 50 kV. The excitation of the condensor 3 and the diameter of the diaphragm 4 should be chosen so that the beam is as parallel as possible and has a small diameter; the parallelism of the beam may be about $5 \times 10^{-4}$ rad and its diameter about 50 $\mu$m.

A part of beam 1 passes through the specimen 7 unchanged and proceeds below the specimen as the primary beam 1'. Another part of beam 1 is reflected at crystal planes of the specimen 7, as is shown in the drawing by the scatter ray 1a.

The additional deflection system 8 is excited in synchronism with deflection system 5/6 in such a manner that the primary beam 1' always strikes the center of the detector 9, i.e., the hole 9a. The primary beam, therefore, is not registered by detector 9; instead it strikes detector 10 disposed behind detector 9. The scattered ray 1a, on the other hand, does strike the detector 9 and does not reach the detector 10.

If it is now assumed that beam 1 strikes a single crystal in the specimen 7, then a part of the incident beam is scattered out if it hits a Bragg reflection position. This part is intercepted and registered by detector 9. If the monitor 12 is connected with detector 9, the reflection lines appear dark against the background on the picture screen (bright-field recording).

If the monitor 12 is connected instead with detector 10, then only the primary beam 1' is registered, and the reflection pattern of a single crystal appears in the form of bright lines on a dark background (dark-field recording).

The detectors 9 and 10 may be designed, for instance, as semiconductor barrier-layer detectors. The invention includes providing only detector 9, with either a central hole 9a or with a primary-beam intercept diaphragm disposed in front of its center. Conversely, only detector 10 may be provided, with an annular diaphragm disposed in front of the detector, or a very small detector 10 may be used, so small that it is not struck by the scattered radiation.

In scanning apparatus according to the invention, a complete high-contrast system of lines containing all information regarding the possible reflections within the scanned solid angle $\Omega$ appears on the monitor. If desired, the monitor picture can be processed further electronically. For example, the intensities of the reflections can be stored quantitatively and can be fed as digital data to a computer for structure analysis. The invention enables the recording of the reflection pattern of thicker single crystals than was possible heretofore because, due to the measurement of the intensity variations of the primary beam (bright field), less scatter background from other directions is registered than with conventional recordings.

In the case of thin single crystals, the secondary stripes become visible at Bragg edges. This allows the thickness of the specimen and the structure potentials to be determined. The uniform illumination of all angles of the crystal, taking place successively in time, yields particularly easy-to-recognize patterns. Particularly in contrast to diagrams with a static primary beam of great convergence (such as described, for instance, by Kossel, Ackermann and Moellenstedt in "Zeitschrift fuer Physik" 120 (1943), page 553), the present invention avoids mutual confusing superpositions by symmetrical bombardment.

I claim:

1. Electron beam scanning apparatus, for the structural analysis of a specimen, of the type having a ray source, a deflection system arranged between the ray source and a specimen for directing the beam always to the same point of the specimen and for scanning a solid angle whose apex is located at said point, and a detector arranged behind the specimen for detecting the radiation penetrating the specimen, wherein the improvement comprises a further deflection system positioned between the specimen and the detector and driven synchronously with the first-mentioned deflection system such that the primary beam portion of the radiation penetrating the specimen always strikes the same point of the detector and the detector having at least one zone for the separate registration of a predetermined one of the primary beam portion and the scattered portion of the radiation penetrating the specimen.

2. Electron beam scanning apparatus according to claim 1 wherein the detector includes a zone having a hole centered at said same point of the detector, the hole having a diameter slightly larger than the diameter of the primary beam portion, whereby the detector zone separately registers only the scattered portion of the radiation penetrating the specimen.

3. Electron beam scanning apparatus according to claim 2 wherein the detector has an additional zone located behind said hole for separately registering only the primary beam portion of the radiation penetrating the specimen.

* * * * *